United States Patent
Zhang et al.

(10) Patent No.: US 10,827,617 B2
(45) Date of Patent: Nov. 3, 2020

(54) PRINTED CIRCUIT BOARD WITH CAVITY

(71) Applicant: Avago Technologies International Sales Pte. Limited, Singapore (SG)

(72) Inventors: Dingyou Zhang, San Jose, CA (US); Nitesh Kumbhat, San Jose, CA (US); Li Sun, San Jose, CA (US); Sarah Haney, San Jose, CA (US); Chang Kyu Choi, Fremont, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 19 days.

(21) Appl. No.: 16/260,429

(22) Filed: Jan. 29, 2019

(65) Prior Publication Data

US 2020/0245465 A1 Jul. 30, 2020

(51) Int. Cl.
| | |
|---|---|
| *H05K 7/00* | (2006.01) |
| *H05K 1/18* | (2006.01) |
| *H05K 1/11* | (2006.01) |
| *H01R 12/57* | (2011.01) |

(52) U.S. Cl.
CPC ............. *H05K 1/183* (2013.01); *H01R 12/57* (2013.01); *H05K 1/111* (2013.01); *H05K 1/181* (2013.01); *H05K 2201/094* (2013.01); *H05K 2201/09472* (2013.01)

(58) Field of Classification Search
CPC ........ H05K 1/183; H05K 1/181; H05K 1/111; H05K 2201/094; H05K 2201/09472; H01R 12/57
See application file for complete search history.

(56) References Cited

U.S. PATENT DOCUMENTS

| | | | | |
|---|---|---|---|---|
| 2006/0042827 A1* | 3/2006 | Chou | ................... | G06K 19/077 174/255 |
| 2006/0131729 A1* | 6/2006 | Lee | ..................... | H01L 21/4803 257/700 |
| 2012/0181074 A1* | 7/2012 | Ishihara | ............... | H05K 3/4691 174/261 |
| 2014/0091428 A1* | 4/2014 | Hossain | .............. | H01L 21/4857 257/532 |
| 2018/0130597 A1* | 5/2018 | Komaya | ............... | H01F 27/292 |
| 2019/0096582 A1* | 3/2019 | Saito | ..................... | H01G 4/248 |
| 2019/0115145 A1* | 4/2019 | Kim | ...................... | H01F 27/292 |
| 2019/0304664 A1* | 10/2019 | Oh | ....................... | H01F 17/0013 |
| 2019/0326061 A1* | 10/2019 | Tomizawa | .............. | H01G 4/12 |
| 2020/0075501 A1* | 3/2020 | Raorane | .................. | H01L 23/49 |

FOREIGN PATENT DOCUMENTS

WO    WO2017171813    * 10/2017

* cited by examiner

*Primary Examiner* — Yuriy Semenenko
(74) *Attorney, Agent, or Firm* — Foley & Lardner LLP

(57) ABSTRACT

An electronic device includes a printed circuit board (PCB) defining a cavity, a first component pad of the PCB positioned outside the cavity, and a second component pad of the PCB positioned on a bottom surface of the cavity. The first component pad has a first thickness, and the second component pad has a second thickness that is less than the first thickness of the first component pad. An electronic component, such as a surface mounted technology (SMT) component, is mounted to the second component pad within the cavity.

20 Claims, 4 Drawing Sheets

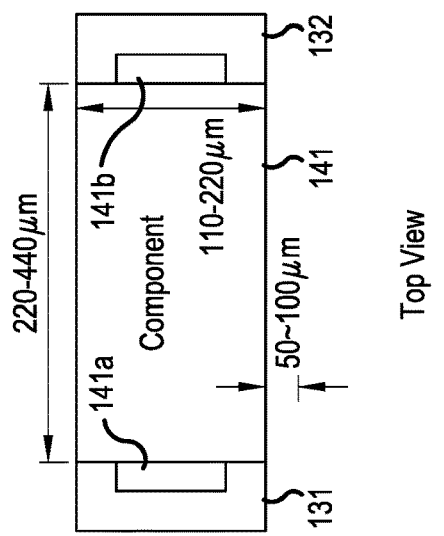
FIG. 2C Top View
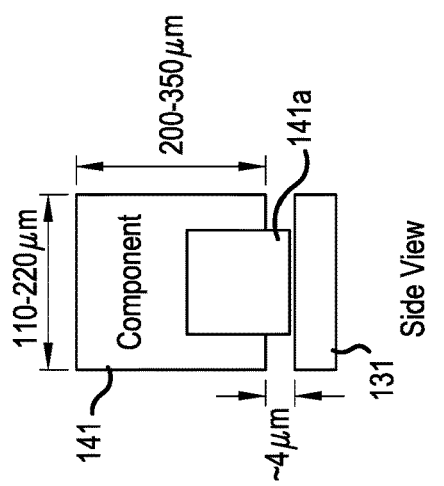
FIG. 2B Side View
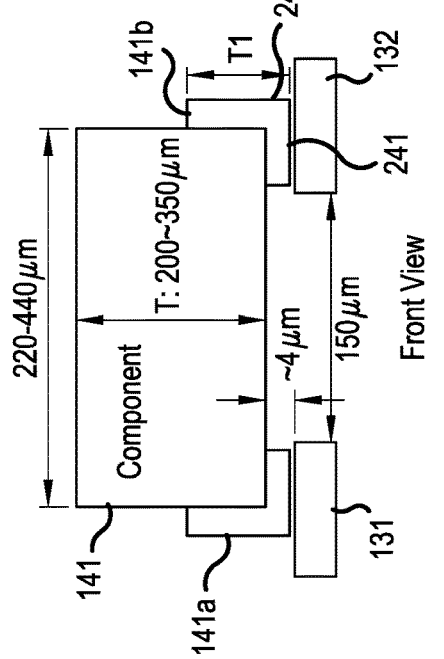
FIG. 2A Front View

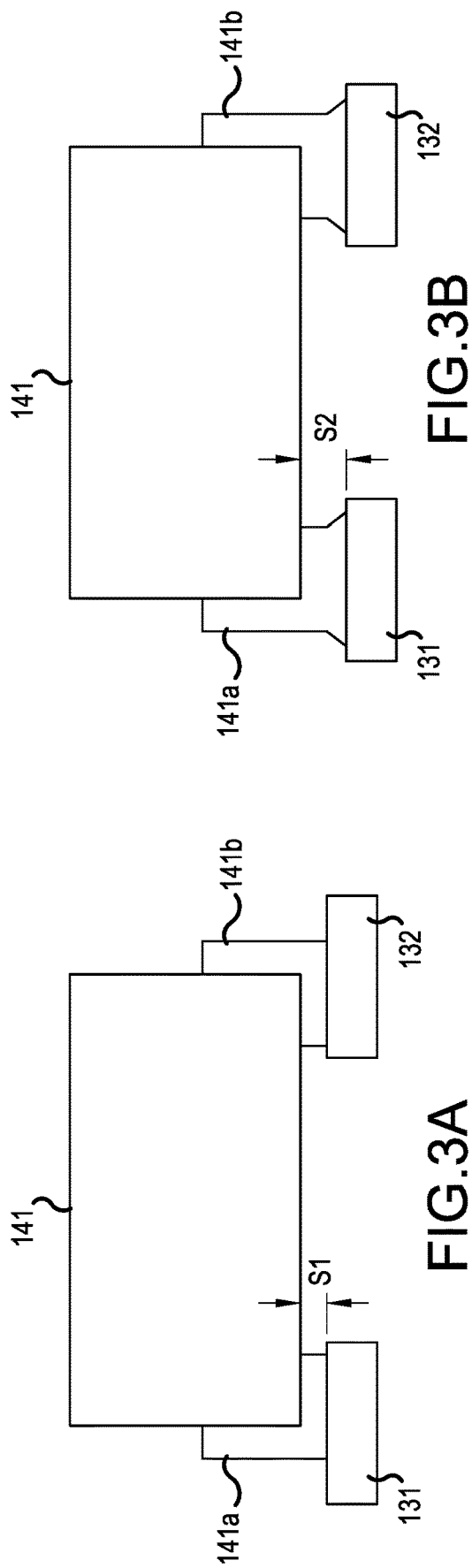
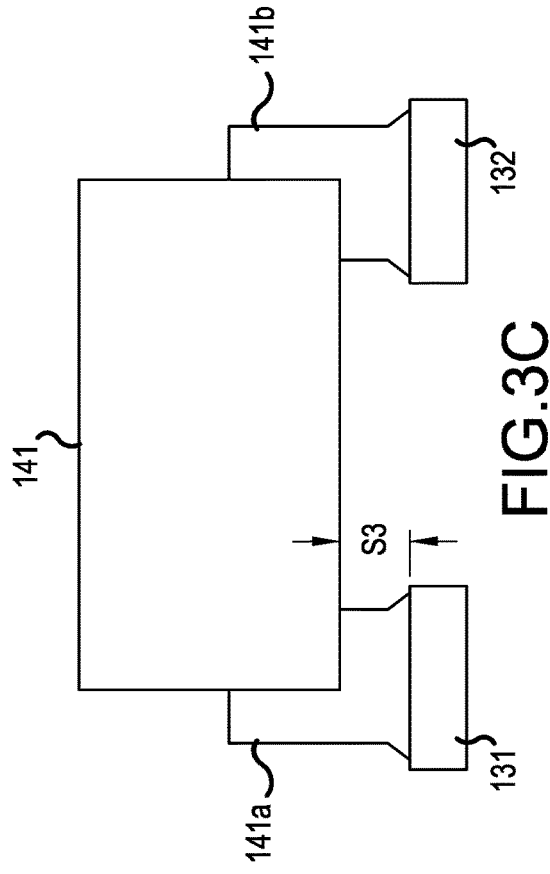

PRINTED CIRCUIT BOARD WITH CAVITY

BACKGROUND

There is steady demand for electronic products, such as cellular telephones, personal communication devices and portable computers, to be physically smaller. Limiting factors that affect the size of an electronic product include the size of each of the solid state modules, which include printed circuit boards (PCBs) and various components mounted to the PCBs, incorporated in the electronic product. For example, surface mount technology (SMT) components may be connected to a top surface of a PCB, in which case the height of the tallest SMT component must be accommodated by the overall height of the module containing the PCB. Inductors, in particular, tend to be taller than other electronic components mounted to a PCB, creating a barrier against overall module height reduction (in a z direction, perpendicular to the top surface of the PCB).

Notwithstanding, product developers and/or manufacturers generally require about 15 percent module height reduction with each new generation of electronic products, for example, while not significantly relaxing requirements in the x and y dimensions (parallel to the top surface of the PCB). Accordingly, modules and/or PCBs within modules are needed that have reduced heights, without negatively affecting performance of the various components and other circuitry contained therein.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2A is a front view of a component having L-shaped terminals, according to a representative embodiment.

FIG. 2B is a side view of the component having L-shaped terminals, according to a representative embodiment.

FIG. 2C is a top of the component having L-shaped terminals, according to a representative embodiment.

FIG. 3A is a front view of a component mounted to pads in a cavity using flux print without solder paste, according to a representative embodiment.

FIG. 3B is a front view of a component mounted to pads in a cavity using is using solder paste with low metal content, according to a representative embodiment.

FIG. 3C is a front view of a component mounted to pads in a cavity using L-shaped terminals formed of tin having increased thickness, according to a representative embodiment.

DETAILED DESCRIPTION

Figure 1:
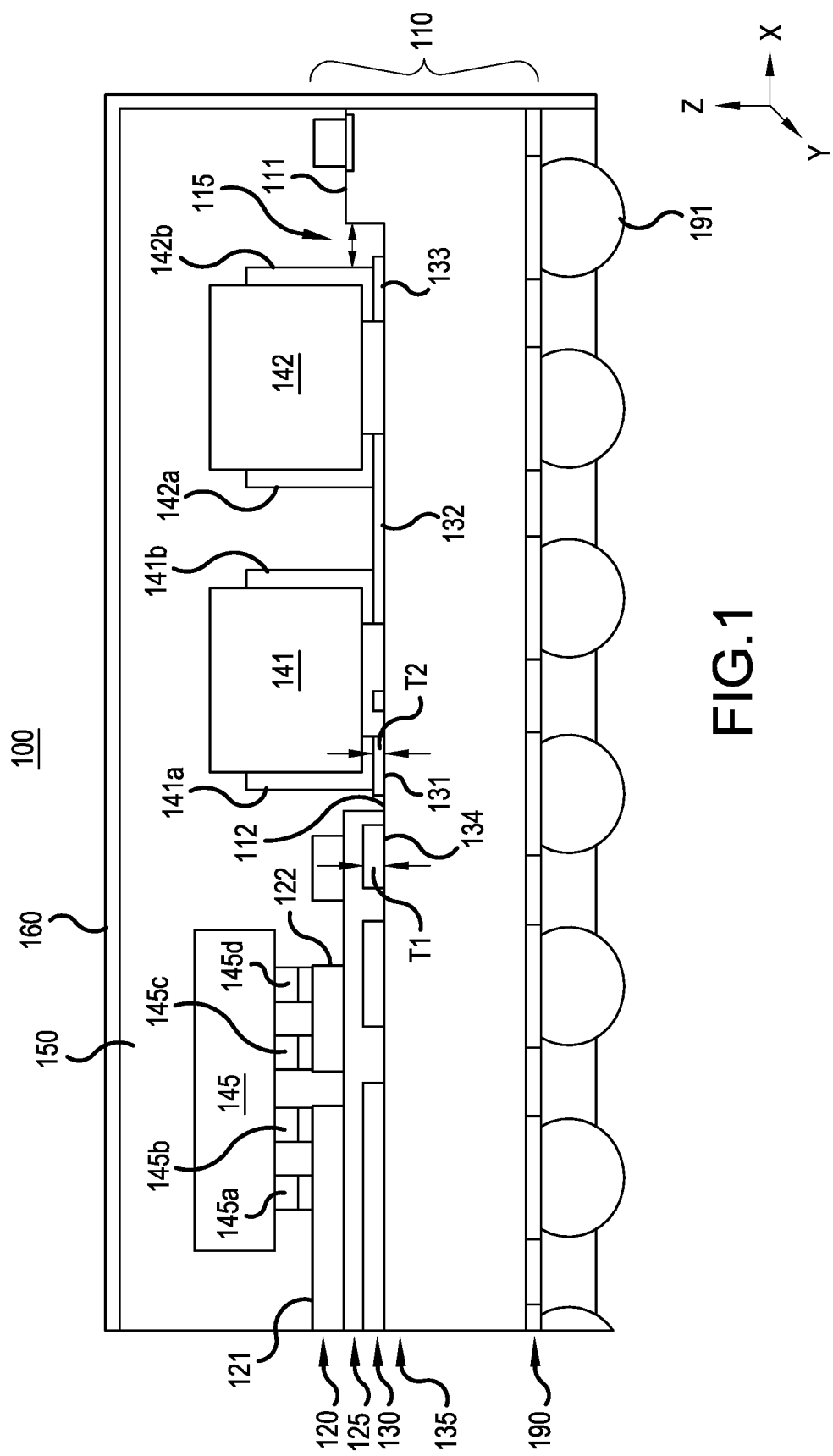
FIG. 1 is a simplified cross-section of a module having a multilayer printed circuit board (PCB) including a component or components inside a cavity, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Generally, according to various embodiments, when component height is a limiting factor with respect to the size of a solid state module or package, one or more cavities may be formed in the top side of a PCB and the tallest component(s) may be placed within the one or more cavities. The depth of each of the one or more cavities may vary to accommodate different heights of the various tall components. This placement lowers the SMT standoff height from PCB top surface, for example, thus reducing the over height of the module.

In addition to placing the tallest component(s) in one or more cavities, additional structural changes may be made to the PCB and/or the components to reduce the overall height of the module. For example, the thickness of pads to which a component is mounted within a cavity may be less than the thickness of pads of the same metal layer outside the cavity. For example, pad thickness inside a cavity may be about 4 μm less than pad thickness (and/or layer thickness) outside cavity at the same metal layer. In addition, the components may use of L-shaped terminals for mounting to the pads. The L-shaped terminals may be mounted to the pads using flux print only without solder paste, reducing the height of the connection and otherwise reducing electrical resistance. Alternatively, the L-shaped terminals may be mounted to the pads using lower metal content solder paste print, resulting in thinner solder under component compared to conventional solder paste print process. Electrical connectivity and improved reliability performance may be further attained by increasing the thickness of tin in the L-shaped terminals.

As a result, the SMT standoff height from the top surface of the PCB may be lowered, and the module height may be reduced by a minimum of about 35 μm. Thus, a component with L-shaped terminals mounted inside a cavity may remain its original height, avoiding decreased radio frequency (RF) performance, for example, that would otherwise result from changing the size of the component. Further, use of the L-shaped terminals may provide improved RF performance of the component with a higher Q value. For example, typical Q value for an inductor with L-shaped terminals is about 40 to about 60, while typical Q value for an inductor with conventional terminals is about 20 to about 40. Otherwise, to achieve the same result using height reduction, component height would need to be reduced from about 0.32 mm to about 0.25 mm to provide the thinner module package, which would lead to the Q value decreasing by approximately 30 percent, compromising RF performance.

FIG. 1 is a simplified cross-section of a module having a multilayer printed circuit board (PCB) including a component or components inside cavity, according to a representative embodiment.

Referring to FIG. 1, a module (electronic device) 100 includes a multilayer PCB 110, including multiple metal layers separated by multiple insulating layers, indicated by representative first metal layer 120, second metal layer 130, first insulating layer 125 (separating the first and second metal layers 120 and 130), and second insulating layer 135, for purposes of illustration. For the sake of convenience, the second insulating layer 135 is shown as a bottom insulating layer, although it is understood that the PCB 110 may include additional metal layer(s) separated by additional insulating layer(s) below the second insulating layer 135, without departing from the scope of the present teachings. The first and second metal layers 120 and 130 may be formed of any electrically conductive material compatible with fabrication of printed circuit boards, such as copper (Cu), gold (Au), silver (Ag) and/or aluminum (Al), for example. The first and second insulating layers 125 and 135 may be formed of any electrically insulating material compatible with fabrication of printed circuit boards, such as prepreg material and/or resin-based dielectric material, for example.

In the depicted embodiment, the first and second metal layers 120 and 130 are patterned to provide circuitry, including pads for connecting electronic devices to the PCB 110. For example, the first metal layer 120 is patterned to provide at least pads 121 and 122 on a first surface 111 of the first insulating layer 125 located outside the cavity 115, and the second metal layer 130 is patterned to provide at least pads 131, 132 and 133 on a second surface 112 of the second insulating layer 135 located inside the cavity 115. The second surface 112 corresponds to the bottom surface or floor of the cavity 115. The pads 121 and 122 may be formed by selective plating or etching the first metal layer 120, and the pads 131, 132 and 133 may be formed by selective plating or wet etching the second metal layer 130, for example, during fabrication of the PCB 110, as discussed further below. Of course, other techniques for fabricating the first and second metal layers 120 and 130, e.g., to form the pads 121, 122 and the pads 131, 132, 133, including other selective additive processes and etching processes, may be incorporated without departing from the scope of the present teachings, as would be apparent to one skilled in the art.

The module 100 further includes various electronic devices mounted to the PCB 110, indicated by illustrative first and second components 141 and 142 mounted to the second surface 112 within the cavity 115, and illustrative flip-chip die 145 mounted to the first surface 111 outside the cavity 115. Each of the first and second components 141 and 142 may be surface mounted technology (SMT) components, for example, although they may be other types of components, such as flip-chip dies or wafer-level package dies, without departing from the scope of the present teachings.

The first component 141 includes illustrative first terminals 141a and 141b mounted to the pads 131 and 132 formed on the second surface 112 at the bottom of the cavity 115, and the second component 142 includes illustrative second terminals 142a and 142b mounted to the pads 132 and 133 formed on the second surface 112 at the bottom of the cavity 115. In the depicted embodiment, each of the first terminals 141a and 141b and the second terminals 142a and 142b are L-shaped terminals, discussed below, although other types of terminals may be incorporated without departing from the scope of the present teachings. Also, flip-chip die 145 includes illustrative die terminals 145a, 145b, 145c and 145d mounted to the pads 121 and 122 formed on the first surface 111 outside the cavity 115. As discussed above, the pads 131, 132 and 133 are formed from the second metal layer 130, and the pads 121 and 122 are formed from the first metal layer 120. Pad 134, which is outside the cavity 115, is also formed from the second metal layer 130, although the thickness of the pad 134 is greater than the thickness of each of the pads 131, 132 and 133, as discussed below.

The module 100 also includes molded compound 150 formed over the first and second surfaces 111 and 112, as well as over the first and second components 141 and 142, the flip-chip die 145, and portions of the first and second metal layers 120 and 130. The molded compound 150 may be formed of a reinforced or non-reinforced epoxy resin, for example, and may be applied using any process compatible with fabrication of semiconductor devices, such as injection molding, transfer molding, or compression molding, for example. The molded compound 150 generally protects the electronic components (e.g., the first and second components 141 and 142, and the flip-chip die 145) and provides additional structural support to the module 100. The molded compound 150 may also hermetically seal the electronic components and other circuitry within the module 100 protecting against environmental elements, such as temperature and moisture.

In addition, the module 100 includes external shield 160 formed over the molded compound 150, to provide additional protection from environmental stress, as well as electromagnetic shielding from external sources. The external shield 160 may be formed of a conductive material (e.g., metal), such as stainless steel, copper (Cu), silver (Ag), gold (Au), or aluminum (Al), for example, or a combination of conductive and non-conductive materials, without departing from the present teachings. Also, in the depicted embodiment, the module 100 is a ball grid array (BGA) component, for example, that includes an array of solder balls, indicated by representative solder ball 191, attached to a bottom layer 190 of the PCB 110. Alternatively, the module 100 may be a land grid array (LGA) component (which does not include the array of solder balls), or various other types of components, without departing from the scope of the present teachings.

For purposes of illustration, the first and second components 141 and 142 are the tallest electronic components (in the vertical or z-direction) on the PCB 110, and therefore generally dictate the overall height of the module 100, which must be high enough to cover the first and second components 141 and 142 with sufficient buffer. For example, the first and second components 141 and 142 mounted to the component pads 131, 132 and 133 may extend through about 65 percent to about 85 percent of the molded compound 150 toward the top of the module 100.

In an embodiment, the first and second components 141 and 145 are inductors, which are typically the tallest components of an electronic circuit, having a component height (in the z-direction) of about 200 nm to about 320 nm, for example. In various embodiments, only inductor(s) are mounted within the cavity 115, while other types of components are mounted to the PCB 110 outside the cavity 115. Attaching the first and second components 141 and 142 to the PCB 110 within the cavity 115 reduces the overall height of the module 100 in the z-direction, as compared to attaching the first and second components 141 and 142 to the PCB 110 outside the cavity 115. For example, the standoff height of the first and second components 141 and 142 from the first surface 111 of the PCB 110 is lowered, and the height of the module 100 may be reduced in the z direction by a minimum of about 35 μm, for example.

In order to further reduce the overall height of the module 100, the thickness of the pads to which the electronic components within the cavity 115 are attached is less than the thickness of the pads formed from the same metal layer outside the cavity 115. So, in the depicted embodiment, the representative pads 131, 132 and 133 on the second surface 112 of the cavity 115, to which the first and second components 141 and 142 are attached, and the representative pad 134 outside the cavity 115, are formed from the same second metal layer 130. A second thickness (T2) of each of the pads 131, 132 and 133 is less than a first thickness (T1) of the pad 134 (and of the second metal layer 130). For example, the first thickness of the pad 134 may equal to the thickness of the second metal layer 130, while the second thickness of each of the pads 131, 132 and 133 may not exceed approximately ¾ (75 percent) of the first thickness of the pad 134 and the second metal layer 130. For example, the second thickness of each of the pads 131, 132 and 133 inside the cavity 115 may be about 10 μm, for example, which is about 4 μm thinner than the first thickness of the pad 134 outside the cavity 115 at the same metal layer.

In order to reduce the thickness of the pads 131, 132 and 133, as compared to the pad 134, the pads 131, 132 and 133 may be exposed to a second etching or selective plating process, and additional surface cleaning process. For example, during fabrication, the second metal layer 130 is applied to a top surface of the second insulating layer 135, and selectively plated or etched to provide a patterned second metal layer 130, including the pads 131, 132, 133 and 134, all of which initially have the same thickness (e.g., the second thickness). The first insulating layer 125 is applied to the patterned second metal layer 130, and the first metal layer 120 is applied to the first insulating layer 125 and likewise patterned by selective plating or etching.

The cavity 115 is formed through the first metal layer 120 (to the extent any portion of the first metal layer 120 remains over the area of the cavity 115 after patterning) and the first insulating layer 125, exposing a portion of the second metal layer 130 within the cavity 115, including the pads 131, 132 and 133. This may be referred to as one-layer cavity depth. The pad 134 of the second metal layer 130 remains covered by at least the first insulating layer 125. Additional etching and/or surface cleaning processes are performed on the exposed portion of the second metal layer 130 in order to reduce the thickness of the metal, including the thickness of the pads 131, 132 and 133, as discussed above. Meanwhile, the portions of the PCB 110 outside the cavity 115 are masked by upper layer(s) to prevent any additional etching of the first metal layer 120, for example. In alternative embodiments, the cavity 115 may be deeper, such as a two-layer cavity depth where the cavity extends through two metal layers and two insulating layers, or a three-layer cavity depth where the cavity extends through three metal layers and three insulating layers. The depth of the cavity 115 may vary to provide unique benefits for any particular situation or to meet application specific design requirements of various implementations, as would be apparent to one skilled in the art.

The height of the first and second components 141 and 142 over the first surface 111 of the PCB 110 can be further reduced, while maintaining or enhancing performance, by using L-shaped terminals to connect to the pads 131, 132 and 133, respectively. FIGS. 2A, 2B and 2C are plan views of a component with L-shaped terminals, according to a representative embodiment. In particular, FIG. 2A is a front view of the first component 141, FIG. 2B is a side view of the first component 141, and FIG. 2C is a top view of the first component 141. It is understood that the configuration may apply equally to the second component 142, or any other components having L-shaped terminals. It is assumed for the sake of illustration that the first component 141 is an inductor.

Referring to FIGS. 2A, 2B and 2C, the first component 141 has first terminals 141a and 141b mounted to the pads 131 and 132, which are formed on the second surface 112 at the bottom of the cavity 115 as shown in FIG. 1. The first terminals 141a and 141b are L-shaped terminals, which may be layered structures having an outermost layer of plated tin (Sn), for example, for forming solder connections to the pads 131 and 132 through wetting, discussed below. However, other materials may be incorporated without departing from the scope of the present teachings. In the depicted example, the first component 141 may have a length of about 220 μm to about 440 μm, a width of about 110 μm to about 220 μm, and a height (T) of about 220 μm to about 350 μm. It is understood that the description of the first terminals 141a and 141b may apply equally to the second terminals 142a and 142b.

Each of the L-shaped first terminals 141a and 141b includes a bottom portion between the first component 141 and the pad 131 or 132, and a side portion extending from the pad 131 or 132 along a side of the first component 141. For purposes of illustration, the L-shaped first terminal 141b is shown to include bottom portion 241 and side portion 242, which would be substantially the same with regard to the L-shaped first terminal 141a. Accordingly, each of the first terminals 141a and 141b covers only a portion of the bottom surface of the first component 141, as well as only a portion of the side (end) surface of the first component 141. The top surface and the other two side surfaces (front and back) of the first component 141 have no contact or connection with the first terminals 141a and 141b. During assembly, solder only wets the first terminals 141a and 141b, e.g., on the respective side surfaces and bottom surfaces. Solder connections are formed mainly between the bottom surfaces of the first terminals 141a and 141b and the pads 131 and 132 through wetting. The solder on the side surfaces of the first and second terminals 141a and 141b connects to the solder on the bottom surfaces, providing additional solder volume as well as mechanical strength.

As shown in FIG. 2A, in particular, an optimal length (T1) of the side portion 242 of the L-shaped first terminal 141b (as well as the L-shaped first terminal 141a) provides the ratio T1/T within in a range of about 0.36 to about 0.60, for example. The thickness of the solder of the bottom portion 241 of the first terminal 141b (as well as the solder of the bottom portion of the first terminal 141a) may be about 4 µm, for example, before attach and reflow. In an embodiment, each of the L-shaped first terminals 141a and 141b may have a sandwich structure, with an inner most layer of metal, a middle layer of another metal, and an outer most layer of tin that attaches to the pads 131 and 132 after reflow. As shown in FIG. 2C, the edge of the first component 141 may be about 50 µm to about 100 µm from the side or edge of the cavity (cavity 115).

In comparison, conventional terminals for attaching an electronic component, such as the first component 141, contact the electric component on five sides, essentially forming caps over the two opposite ends of the electronic component. Since a conventional terminal contacts the electronic component on five sides and the L-shaped terminal of the present embodiment only contacts the electronic component on three sides, the L-shaped terminal has substantially less contact area with the electronic component than the conventional terminal. This results in reduced parasitic elements (e.g., parasitic capacitance) of the electronic component having the L-shaped terminals, and thus better RF performance due to less metal coupling per Equation 1, where C is capacitance, ε is a constant, A is the contact area, and d is dielectric thickness between two metal electrodes:

$$C = \varepsilon A/d \quad \text{Equation (1)}$$

In addition, the height of the first and second components 141 and 142 over the first surface 111 of the PCB 110 can be further reduced, while maintaining or enhancing performance, by using less or different types of solder connections between the L-shaped terminals and the pads 131, 132 and 133, respectively. FIGS. 3A, 3B and 3C are front views of a component with L-shaped terminals and different types of solder application, according to representative embodiment. It is understood that the configurations may apply equally to the second component 142, or any other components. It is assumed for the sake of illustration that the first component 141 is an inductor.

FIG. 3A is a front view of the first component 141 with the first terminals 141a and 141b mounted to the pads 131 and 132, formed on the second surface 112 at the bottom of the cavity 115 as shown in FIG. 1, using flux print without solder paste. That is, the first terminals 141a and 141b are surface mounted to the pads 131 and 132 in the cavity 115 using a flux print process, which involves solder coming from the component terminals only (i.e., without solder paste). This results in reduced solder thickness between first component 141 and each of the pads 131 and 132. For example, S1 in FIG. 3A may be about 4 µm to about 7 µm on the first terminal 141a before attaching to PCB, and 1 µm to about 3 µm using the flux print process after reflow, as compared to at least about 10 µm using conventional solder paste print. The reduced solder thickness leads to lower resistance, and thus improved electrical performance of the first component 141, as well as further reduced overall height of the module 100.

FIG. 3B is a front view of the first component 141 with the first terminals 141a and 141b mounted to the pads 131 and 132, formed on the second surface 112 at the bottom of the cavity 115 as shown in FIG. 1, using solder paste with low metal content. That is, the first terminals 141a and 141b are surface mounted to the pads 131 and 132 in the cavity 115 using a lower metal content solder paste print process. The lower metal content may be about 10 percent to about 30 percent less tin (or lead) in the solder paste as compared to conventional solder paste. The lower metal content solder paste print process results in greater solder thickness between first component 141 and each of the pads 131 and 132 as compared to solder thickness from the flux print process. For example, S2 in FIG. 3B may be about 3 µm to about 10 µm after reflow using the lower metal content solder paste print process. The thicker solder provides better reliability of the first component 141, as well as further reduced overall height of the module 100 (although not as much height reduction as that obtained using the flux print process, discussed above).

FIG. 3C is a front view of the first component 141 with the first terminals 141a and 141b mounted to the pads 131 and 132, formed on the second surface 112 at the bottom of the cavity 115 as shown in FIG. 1, using L-shaped first terminals 141a and 141b formed of tin, and having increased thickness. That is, at least the bottom portions of the first terminals 141a and 141b are thicker than the bottom portions of the first terminals 141a and 141b shown in FIG. 3A, for example, and are surface mounted to the pads 131 and 132 in the cavity 115 using a flux print process. For example, S3 in FIG. 3C may be about 8 µm to about 11 µm before attaching to a PCB. Also, the solder thickness on the sides of the L-shaped first terminals 141a and 141b may be increased, having a thickness of about 6.5 µm to about 10.5 µm before attaching to the PCB, as compared to a thickness of about 3 µm to about 9 µm for the side portions of the first terminals 141a and 141b shown in FIG. 3A, for example. The thicker solder provides better reliability as well as mechanical strength of the first component 141. In an embodiment, thicker tin may be applied on both the bottom and side portions of the first terminals 141a and 141b. Thicker tin on the bottom portions provides better reliability performance, while thicker tin on the side portions provides better mechanical strength. Some tin from side portions of the first terminals 141a and 141b may reflow to the bottom portions during mounting.

As mentioned above, formation of the cavity 115, as well as incorporating thin pads 131, 132 and 133 in the cavity 115, L-shaped terminals on the first and second components 141 and 142 (e.g., inductors) and/or lower solder profiles, enables use of taller first and second components 141 and 142 mounted to the second surface 112 of the cavity 115 than could otherwise be used if mounted to the first surface 111 outside the cavity 115, while not increasing (and possibly decreasing) the overall height of the module 100. For example, when the cavity 115 has a one layer cavity depth, the first and second components 141 and 142 may have a typical height, e.g., for an inductor, of about 0.32 mm, and still achieve overall height reduction of the module 100. Without the cavity 115, the first and second components 141 and 142 would have to have a height of about 0.25 mm to obtain a module having the same overall height.

Generally, a taller inductor allows bigger core and thicker wiring, thus more magnetic flux, which leads to higher Q value, as shown in Equations (2) and (3):

$$L = \mu N^2 A/l \quad \text{Equation (2)}$$

$$Q = \omega L/R \quad \text{Equation (3)}$$

Referring to Equation (2), µ is a constant, N is the number of turns of the inductor coil, A is the area of the inner core, and l is the length of the coil. Referring to Equation (2), R is DC resistance, and ω is the radian operating frequency. The height of the inductor mainly affects the area A of the inner core or the number of turns N of the inductor coil.

As discussed above, according to the various embodiments, the standoff height of each of the first and second components 141 and 142 (e.g., inductors) from the first surface 111 of the PCB 110 is lowered and the height of the module 100 is reduced in the z direction by a minimum of abut 35 um. That is, the first and second components 141 and 142, e.g., with the L-shaped first and second terminals 141a, 141b and 142a, 142b, respectively, may remain at the original height, and therefore provide improved RF performance with higher Q (e.g., the higher Q being in a range from about 40 to about 60). Otherwise, without the cavity 115, the component height of the first and second components 141 and 142 would need to be reduced from about 0.32 mm to about 0.25 mm to achieve thinner module, which leads to Q values decreased by approximately 30 percent, thereby compromising RF performance of the first and second components 141 and 142, for example.

Figure 4:
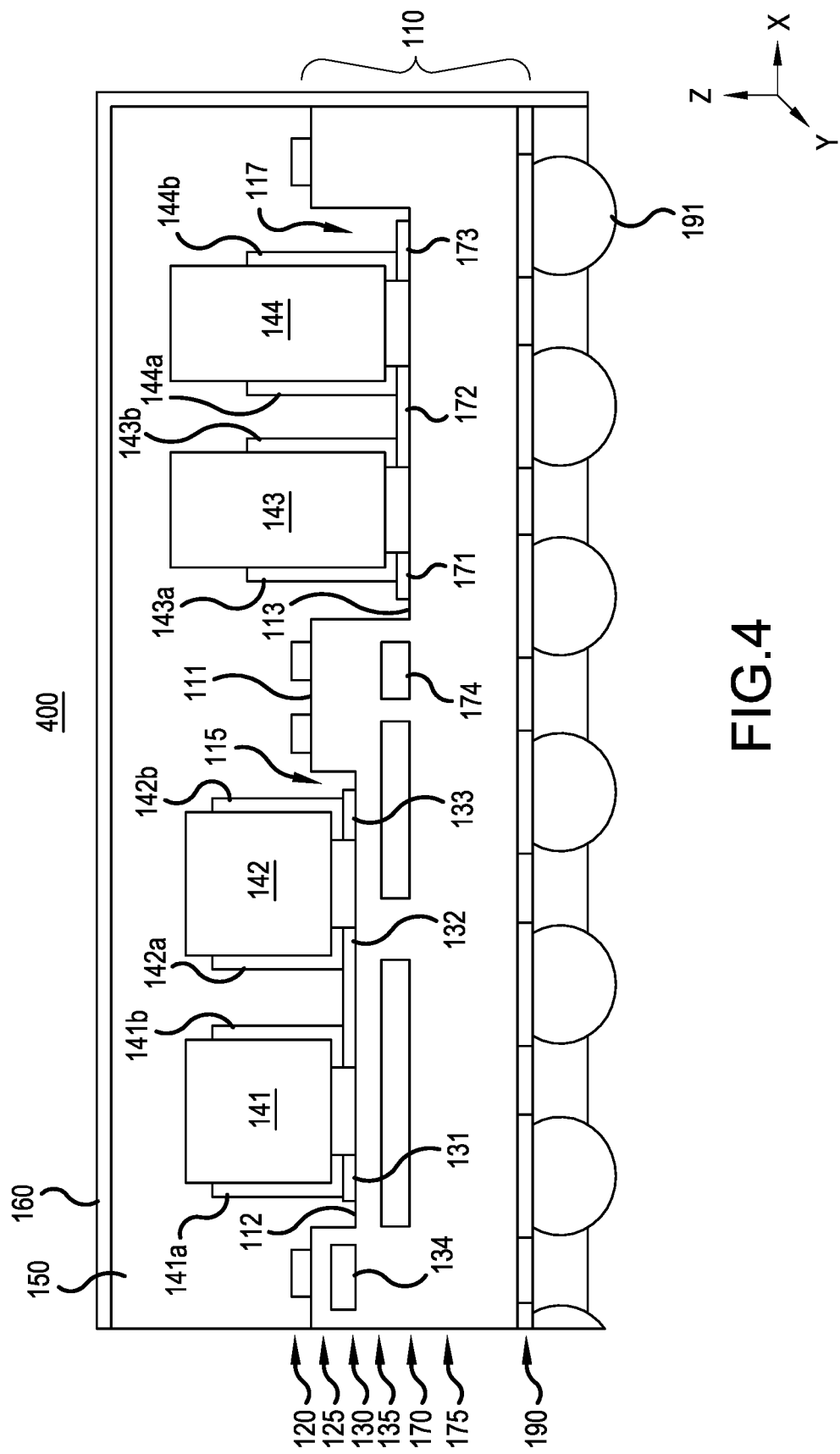
FIG. 4 is a simplified cross-section of a module having a multilayer PCB including components inside cavities, according to a representative embodiment.

FIG. 4 is a simplified cross-section of a module having a multilayer PCB including components inside multiple cavities, according to a representative embodiment.

Referring to FIG. 4, a module 400 includes a multilayer PCB 410, including multiple metal layers separated by multiple insulating layers, indicated by representative first metal layer 120, second metal layer 130, third metal layer 170, first insulating layer 125 (separating the first and second metal layers 120 and 130), second insulating layer 135 (separating the second and third metal layers 130 and 170), and third insulating layer 175, for purposes of illustration. For the sake of convenience, the third insulating layer 175 is shown as a bottom insulating layer, although it is understood that the PCB 410 may include additional metal layer (s) separated by additional insulating layer(s) below the third insulating layer 175, without departing from the scope of the present teachings. The first, second and third metal layers 120, 130 and 170 may be formed of any electrically conductive material compatible with fabrication of printed circuit boards, such as copper (Cu), gold (Au), silver (Ag) and/or aluminum (Al), for example. The first, second and third insulating layers 125, 135 and 175 may be formed of any electrically insulating material compatible with fabrication of printed circuit boards, such as prepreg material and/or resin-based dielectric material, for example.

In the depicted embodiment, the first, second and third metal layers 120, 130 and 170 are patterned to provide circuitry, including pads for connecting electronic devices to the PCB 410. For example, the first metal layer 120 is patterned to provide at least pads 121 and 122 (not shown in FIG. 4) on a first surface 111 of the first insulating layer 125 located outside the cavity 115, the second metal layer 130 is patterned to provide at least pads 131, 132 and 133 on a second surface 112 of the second insulating layer 135 located inside the cavity 115, and the third metal layer 170 is patterned to provide at least pads 171, 172 and 173 on a third surface 113 of the third insulating layer 175 located inside an additional cavity 117. The second surface 112 corresponds to the bottom surface or floor of the cavity 115, and the third surface 113 corresponds to the bottom surface or floor of the cavity 117. The pads 121 and 122 may be formed by etching the first metal layer 120, the pads 131, 132 and 133 may be formed by selective plating or etching the second metal layer 130, and the pads 171, 172 and 173 may be formed by selective plating or etching the third metal layer 170, for example, during fabrication of the PCB 410, as discussed further below.

The module 400 further includes various electronic devices mounted to the PCB 410, indicated by illustrative first and second components 141 and 142 mounted to the second surface 112 within the cavity 115, and third and fourth components 143 and 144 mounted to the third surface 113 within the cavity 117. Additional electronic devices (not shown in FIG. 4) may be mounted outside the cavities 115 and 117, on the first surface 111, such as the illustrative flip-chip die 145 mounted to the first surface 111 shown in FIG. 1, without departing from the scope of the present teachings. Each of the first, second, third and fourth components 141, 142, 143 and 144 may be SMT components, for example, although they may be other types of components, such as flip-chip die or wafer-level package die, without departing from the scope of the present teachings.

The first component 141 includes illustrative first terminals 141a and 141b mounted to the pads 131 and 132 formed on the second surface 112 at the bottom of the cavity 115, and the second component 142 includes illustrative second terminals 142a and 142b mounted to the pads 132 and 133 formed on the second surface 112 at the bottom of the cavity 115, as discussed above. Likewise, the third component 143 includes illustrative third terminals 143a and 143b mounted to the pads 171 and 172 formed on the third surface 113, and the fourth component 144 includes illustrative fourth terminals 144a and 144b mounted to the pads 172 and 173 formed on the third surface 113. In the depicted embodiment, each of the third terminals 171a and 171b and the fourth terminals 172a and 172b may be L-shaped terminals, discussed above, although other types of terminals may be incorporated without departing from the scope of the present teachings.

The pads 131, 132 and 133 are formed from the second metal layer 130, and the pads 171, 172 and 173 are formed from the third metal layer 170. The pad 134 is also formed from the second metal layer 130, although the thickness of the pad 134 is greater than the thickness of each of the pads 131, 132 and 133. Similarly, the pad 174, which is outside the cavity 117 (and the cavity 115), is formed from the third metal layer 170, although the thickness of the pad 174 is greater than the thickness of each of the pads 171, 172 and 173.

The module 400 also includes the molded compound 150, as discussed above, formed over the first, second and third surfaces 111, 112 and 113, as well as over the first, second third and forth components 141, 142, 143 and 144, the flip-chip die 145, and portions of the first, second and third metal layers 120, 130 and 170. In addition, the module 400 includes external shield 160, as discussed above, formed over the molded compound 150.

For purposes of illustration, the first and second components 141 and 142 are the tallest electronic components (in the vertical or z-direction) on the PCB 110, and therefore generally dictate the overall height of the module 100, which must be high enough to cover the first and second components 141 and 142 with sufficient buffer. For example, the first and second components 141 and 142 mounted to the component pads 131, 132 and 133 may extend through about 65 percent to about 85 percent of the molded compound 150 toward the top of the module 100.

In an embodiment, the third and fourth components 143 and 144 are also inductors, for example, and are taller than the first and second components 141 and 142. Accordingly, the third and fourth components 143 and 144 are mounted in the cavity 117, which is deeper than the cavity 115, so that the overall height of the module 400 may be reduced in the z-direction, as compared to attaching the third and fourth components 143 and 144 to the PCB 410 outside the cavity 117 (such as to the surface 112 within the cavity 115 or to the first surface 111 outside of both the cavities 115 and 1117). For example, the standoff height of the third and fourth components 143 and 144 (along with the first and second components 141 and 142) from the first surface 111 of the PCB 410 is lowered, and the height of the module 400 may be reduced in the z direction.

In order to further reduce the overall height of the module 400, the thickness of the pads to which the electronic components within the cavity 117 are attached is less than the thickness of the pads formed from the same metal layer outside the cavity 117. So, in the depicted embodiment, the representative pads 171, 172 and 173 on the third surface 113 of the cavity 117, to which the third and fourth components 143 and 144 are attached, and the representative pad 174 outside the cavity 117, are formed from the same third metal layer 170. That is, a fourth thickness (T4) of each of the pads 171, 172 and 173 is less than a third thickness (T3) of the pad 174 (and of the third metal layer 170). For example, the third thickness of the pad 174 may equal to the thickness of the third metal layer 170, while the fourth thickness of each of the pads 171, 172 and 173 may not exceed approximately ¾ (75 percent) of the third thickness of the pad 174 and the third metal layer 170. For example, the fourth thickness of each of the pads 171, 172 and 173 inside the cavity 117 may be about 10 μm, for example, which is about 4 μm thinner than the third thickness of the pad 174 outside the cavity 117 at the same metal layer. In an embodiment, the third thickness may be the same as or different from the first thickness of the pad 134 (and of the second metal layer 130), and the fourth thickness may be the same as or different from the second thickness of the pads 131, 132 and 133, discussed above, without departing from the scope of the present teachings.

In order to reduce the thickness of the pads 171, 172 and 173, as compared to the pad 174, the pads 171, 172 and 173 may be exposed to an additional (e.g., third) etching/selective additive and cleaning processes, similar to the additional etching/selective additive and cleaning processes discussed above with respect to the thickness of the pads 131, 132 and 133. Likewise, the process of forming the cavity 117 is similar to that of forming the cavity 115, as would be apparent to one skilled in the art. Accordingly, descriptions of these processes will not be repeated, herein. The cavity 117 may be referred to as having a two-layer cavity depth. That is, the cavity depth of the cavity 117 extends through the first metal layer 120, the first insulating layer 125, the second metal layer 130 and the second insulating layer 135.

The height of the third and fourth components 143 and 144 over the first surface 111 of the PCB 410 may be further reduced, while maintaining or enhancing performance, by using L-shaped terminals 143a, 143b and 144a, 144b to connect to the pads 171, 172 and 173, respectively, as discussed above with reference to the first and second components 141 and 142 and FIGS. 2A, 2B and 2C, for example. Likewise, the height of the third and fourth components 143 and 144 over the first surface 111 of the PCB 410 may be further reduced, while maintaining or enhancing performance, by using less or different types of solder connections between the L-shaped terminals 143a, 143b and 144a, 144b and the pads 171, 172 and 173, respectively, as discussed above with reference to the first and second components 141 and 142 and FIGS. 3A, 3B and 3C, for example.

In various embodiments, the number and depths of cavities in a PCB may vary from that shown in FIGS. 1 and 4, for example, without departing from the scope of the present teachings. Also, although each of the cavities 115 and 117 is depicted as having two electronic components mounted therein, it is understood that fewer or more than two electronic components may be mounted in the various cavities, without departing from the scope of the present teachings.

Further, although the first, second, third and fourth components 141, 142, 143 and 144 have been described as inductors, for purposes of illustration, it is understood that any type of electronic component (typically the tallest among the electronic components mounted to a particular PCB) may be mounted within the one or more cavities formed in the PCB.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A electronic device comprising:
a printed circuit board (PCB) defining a cavity;
a first component pad of the PCB positioned outside the cavity, the first component pad having a first thickness; and
a second component pad of the PCB positioned on a bottom surface of the cavity, the second component pad having a second thickness that is less than the first thickness of the first component pad, wherein an electronic component is mounted to the second component pad.

2. The device of claim 1, wherein the second thickness of the second component pad does not exceed about ¾ of the first thickness the first component pad.

3. The device of claim 1, wherein the second thickness of the second component pad is about 4 μm less than the first thickness the first component pad.

4. The device of claim 1, wherein the first component pad is formed from a first metal layer of the PCB and the second component pad is formed from the first metal layer of the PCB.

5. The device of claim 1, wherein the electronic component comprises an L-shaped terminal for mounting to the second component pad, the L-shaped terminal comprising a bottom portion between the electronic component and the second component pad and a side portion extending from the bottom portion along a side of the electronic component.

6. The device of claim 5, wherein the L-shaped terminal is mounted to the second component pad using flux print without solder paste.

7. The device of claim 5, wherein the L-shaped terminal is mounted to the second component pad using solder paste with low metal content.

8. The device of claim 6, wherein the L-shaped terminal is formed of tin, and a thickness of the bottom portion is from about 1 μm to about 3 μm, after reflow.

9. The device of claim 5, wherein the L-shaped terminal is formed of tin, and a thickness of the bottom portion is from about 8 μm to about 11 μm.

10. The device of claim 5, wherein a ratio of a height of the L-shaped terminal and a height of the electronic component is in a range from about 0.36 to about 0.60.

11. The device of claim 5, wherein the side portion of the L-shaped terminal is about 50 μm to about 100 μm from an edge of the cavity.

12. The device of claim 1, wherein the electronic component mounted to the second component pad comprises a surface mounted technology (SMT) component.

13. The device of claim 1, further comprising:
molded compound disposed over a top surface of the PCB and the cavity, wherein the electronic component mounted to the second component pad extends through about 65 percent to about 85 percent of the molded compound.

14. The device of claim 1, wherein the electric component is a first electric component, and wherein the first electronic component is taller than a second electronic component mounted to the first component pad.

15. A printed circuit board (PCB) comprising:
a first cavity formed in a top surface of the PCB;
at least one first component pad, each of the at least one first component pad being formed outside the first cavity and having a first thickness; and
at least one second component pad, each of the at least one second component pad being formed on a bottom surface of the first cavity from a same layer as the at least one first component pad and having a second thickness that is less than the first thickness, wherein at least one surface mounted technology (SMT) component is mounted within the first cavity to the at least one second component pad, respectively.

16. The PCB of claim 15, wherein the at least one SMT component comprises at least one inductor.

17. The PCB of claim 16, wherein no type of component other than the at least one inductor is mounted within first the cavity.

18. The PCB of claim 15 further comprising:
a second cavity formed in the top surface of the PCB, the second cavity have a different depth than the first cavity;
at least one third component pad, each of the at least one third component pad being formed outside the second cavity and having a third thickness; and
at least one fourth component pad, each of the at least one fourth component pad being formed on a bottom surface of the second cavity from a same layer as the at least one third component pad and having a fourth thickness that is less than the third thickness, wherein at least one SMT component is mounted within the second cavity to the at least one third component pad, respectively.

19. The PCB of claim 18, wherein the at least one SMT component mounted within the second cavity comprises at least one inductor.

20. A electronic device comprising:
a printed circuit board (PCB) defining a cavity and a plurality of metal layers;
a first component pad formed from a first metal layer of the PCB positioned outside the cavity, the first component pad having a first thickness; and
a second component pad formed from the first metal layer of the PCB positioned on a bottom surface of the cavity, the second component pad having a second thickness that is less than the first thickness, wherein a tallest electronic component among a plurality of electronic components mounted to the PCB is mounted to the second component pad.

* * * * *